United States Patent

Tsutsui et al.

Patent Number: 5,922,623
Date of Patent: *Jul. 13, 1999

[54] HYDROGEN FLUORIDE VAPOR PHASE SELECTIVE ETCHING METHOD FOR FABRICATING SEMICONDUCTOR DEVICES

[75] Inventors: Hiroaki Tsutsui; Takao Matsumura; Hirokazu Oikawa; Masayuki Yokoi; Junichi Nakamura; Hiroyuki Sato; Jun Mizoe, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/646,967

[22] Filed: May 8, 1996

Related U.S. Application Data

[30] Foreign Application Priority Data

May 9, 1995 [JP] Japan .................................. 7-110376

[51] Int. Cl.⁶ .................................................. H01L 21/302
[52] U.S. Cl. ........................................... 438/743; 438/735
[58] Field of Search ...................... 438/706, 735, 438/737, 743; 216/58, 73, 74, 79, 72

[56] References Cited

U.S. PATENT DOCUMENTS

| | | |
|---|---|---|
| 4,749,440 | 6/1988 | Blackwood et al. .................... 156/646 |
| 5,173,152 | 12/1992 | Tanaka ..................................... 156/646 |
| 5,268,069 | 12/1993 | Chapple-Sokol et al. .............. 156/646 |
| 5,322,809 | 6/1994 | Moslehi ..................................... 437/41 |
| 5,567,332 | 10/1996 | Mehta ....................................... 216/57 |
| 5,635,102 | 6/1997 | Mehta ..................................... 428/428 |
| 5,658,417 | 8/1997 | Watanabe et al. ...................... 156/345 |
| 5,662,772 | 9/1997 | Scheiter et al. ............................. 216/2 |
| 5,766,994 | 6/1998 | Tseng ..................................... 438/254 |

FOREIGN PATENT DOCUMENTS 574817 3/1993 Japan .

*Primary Examiner*—Marion McCamish
*Assistant Examiner*—Cheryl Juska
*Attorney, Agent, or Firm*—Whitham, Curtis & Whitham

[57] ABSTRACT

Disclosed is a method selective of vapor phase etching for fabricating a semiconductor device having a refractory metal silicide electrode abutting a silicon oxide film on the surface or a semiconductor device having an AlGaAs layer, an electrode formed on the AlGaAs layer and a silicon oxide film on the surface of the semiconductor device. The method comprises a step of removing a portion of the silicon oxide film by a gas including a vapor of hydrogen fluoride. The method further uses a mixture of nitrogen gas including vapor of anhydrous hydrofluoric acid and a nitrogen gas including a vapor of $H_2O$, wherein the ratio of the nitrogen gas including the vaporized anhydrous hydrofluoric acid to the nitrogen gas including vapor of $H_2O$ is less than 1.

18 Claims, 5 Drawing Sheets

HYDROGEN FLUORIDE VAPOR PHASE SELECTIVE ETCHING METHOD FOR FABRICATING SEMICONDUCTOR DEVICES

BACKGROUND OF THE INVENTION

1. Field of the Invention

The present invention relates to a method selective of vapor phase etching for fabricating semiconductor devices, and particularly to such a method comprising a step of removing a silicon oxide film formed on a semiconductor substrate.

2. Description of the Related Art

There will be explained hereinafter steps of removing a silicon oxide film formed on a semiconductor substrate according to conventional semiconductor device fabrication methods. A similar conventional technique is proposed in the gazette of Japanese Patent Laid Open (Kokai) No. 5(1993)-74817.

First, with reference to FIG. 4, a method of fabricating a semiconductor device having a GaAs MESFET (metal semiconductor field effect transistor) construction will be described as a first conventional example.

FIG. 4(a) is a cross sectional diagram depicting a semiconductor substrate with a silicon oxide film 6 formed on its surface. The semiconductor substrate 1 comprises a semi-insulating GaAs substrate 1, an undoped GaAs buffer layer 2, a GaAs channel layer 3 which is doped with Si impurities, and a GaAs cap layer 5 which is doped with Si impurities and is formed only at a region thereof on which a source and a drain are to be formed.

The silicon oxide film 6 is removed over a portion of the semiconductor substrate at which a gate is to be formed, and a Schottky metal film 7, a tungsten silicide (WSi) film in this example, is deposited by means of a conventional sputtering method. On this WSi film, a metal film 8 for further decreasing a gate resistance, a gold (Au) film in this example, is formed by means of a conventional sputtering method. Next, by conventional photolithography and etching technique, such as ion-milling or dry-etching using resist films as masks, the metal films comprised of the WSi film 7 and the Au film 8 are removed except for a region on which a gate electrode is to be formed. After that, the resist film is removed, to obtain a gate electrode as shown in FIG. 4(b).

At this time, a thick silicon oxide film 6 having a dielectric constant of approximately 4 exists adjacent to the gate electrode. Accordingly a capacitance associated with the gate electrode will be so large that the high frequency characteristics of the FET is severely deteriorated. Therefore, as shown in FIG. 4(c), this thick silicon oxide film 6 is removed by means of wet etching using an etching liquid containing hydrofluoric acids. After that, as shown in FIG. 4(d), a thin silicon oxide film 10 is formed as a passivation film.

The reasons that wet etching by hydrofluoric acids is used for removing the silicon oxide film is: that the etching should be isotropic in order to etch under the eave of a gate metal, that dry etching induces crystallographic damage to the semiconductor, and that wet etching is advantageous from the view point of production cost.

Lastly, as shown in FIG. 4(e), ohmic electrodes 11, e.g. AuGeNi in this example, corresponding to a source electrode and a drain electrode, are formed by steps of forming an opening on the silicon oxide passivation film 10, depositing, lifting-off, and annealing a metal film for the ohmic electrode, and so forth, thereby completing the MESFET structure fabrication.

Another conventional method of producing a semiconductor device having an AlGaAs/GaAs HJFET (hetero junction field effect transistor) construction will be described with reference to FIG. 5.

In FIG. 5(a), the semiconductor substrate 1 comprises a semi-insulating GaAs substrate 1, an undoped GaAs buffer layer 2, a GaAs channel layer 3 which is not doped, an $Al_{0.2}Ga_{0.8}As$ layer 4 which is made into an election supplying layer, and an GaAs cap layer 5 which is doped with impurities of high concentration and is left over only at a region thereof on which a source and a drain are to be formed.

First, the silicon oxide film b is partially removed over a portion of the semiconductor substrate at which a gate is to be formed. Subsequently, a Schottky metal film 9, e.g. a tungsten (W) film in this example, is deposited by a conventional sputtering method. Next, by means of the usual photolithography and dry etching method using a photoresist as a mask, the metal film 9 is selectively etched away to form a gate electrode. After that, the photoresist is removed forming a gate electrode as shown in FIG. 5(b).

Hereafter, similar to the first conventional example, the silicon oxide film 6 is removed by wet etching using the hydrofluoric acid based etching liquid (FIG. 5(c)). Next, a passivation silicon oxide film 10 is formed over the entire surface as shown in FIG. 5(d). Finally, ohmic electrodes 11 corresponding to a drain electrode and a source electrode are formed (FIG. 5(e)), thereby completing a semiconductor device having an HJFET structure.

In such conventional semiconductor device fabrication methods, heat resistant refractory metal silicides such as tungsten silicide (WSi) 7 are frequently used as a Schottky metal, due to reliability considerations. In such cases, there is a problem that when the silicon oxide film 6 is wet etched by the hydrofluoric acid based etching liquid, a lower side wall portion of the WSi film 7 is partially dissolved as shown in FIG. 4(c). The reason for this phenomena is understood to be that when the refractory metal silicide film 7 is formed within the opening formed on the silicon oxide film 6 by sputtering, a portion of the silicide film 7 adjacent to the silicon oxide film 6 is changed in chemical composition and physical structure, so that a region that does not have resistance to the hydrofluoric acid based etching liquid is formed. When this dissolution of the refractory metal silicide occurs, the shape of the gate electrode is locally deformed, so that the distribution of the electric field and the current density becomes non-uniform, resulting in the deterioration of the electrical characteristics and the reliability of the FET.

In the second conventional example, where the layer just below the silicon oxide layer 6 is the AlGaAs 4 layer there is a problem that a portion of the AlGaAs 4 layer located in the vicinity of the gate electrode metal is dissolved during wet etching with the hydrofluoric acid based liquid due to an electrochemical reaction. In this case, the shape of the surface of the semiconductor is changed and the depletion layer formed beneath is deformed, which brings a decrease in the saturation current.

SUMMARY OF THE INVENTION

The semiconductor device fabrication method according to the present invention is characterized by comprising a step using a gas containing vapor of hydrogen fluoride to remove a silicon oxide film disposed on a semiconductor substrate having an electrode made of a high melting point metal silicide.

The semiconductor device fabrication method according to the present invention is also characterized by comprising a step using a gas containing vapor of hydrogen fluoride to remove a silicon oxide film disposed on a semiconductor substrate having a construction in which an electrode is disposed on an AlGaAs layer.

In case of either wet etching or vapor phase etching, the chemical reaction occurring are as follows:

$$2HF + H_2O \longleftrightarrow H_3O^+ + HF_2^- \quad (1)$$

$$SiO_2 + 2H_3O^+ + 2HF_2^- \longleftrightarrow SiF_4 + 4H_2O \quad (2)$$

$$SiF_4 + HF_2^- + H_2O \longleftrightarrow SiF_6^{2-} + H_3O^+ \quad (3)$$

the reaction expressed by equation (1), HF is ionized by water, i.e., the reaction requires the presence of $H_2O$. In case of wet etching, the overall etching reaction is not rate-limited by reaction (1) because of existence of an abundance of water. It is appreciated that once the ionizing reaction starts, the reaction expressed by equation (2) moves toward the right, generating $H_2O$ to attain a positive feedback, thereby accelerating the reaction.

However, in case of a vapor phase etching, the amount of $H_2O$ for ionizing HF is not sufficient. The amount of $H_2O$ collected at the surface of the substrate varies depending on the condition of the surface of the substrate, that is, whether the surface of the substrate is hydrophilic or hydrophobic. The reaction expressed by equation (1) commences only when $H_2O$ is collected sufficiently on the surface of the substrate. Further, the degree of feedback for the reaction to continue varies depending on whether $H_2O$ made by reaction (2) is used for reaction (1), or is vaporized to be lost. Therefore, in case of vapor phase etching, the etching reaction rather delicately depends on the material quality of the silicon oxide film.

There is caused in the first conventional example the phenomenon in which a portion of the WSi film is dissolved by wet etching. It is appreciated that this phenomenon is due to a reaction in which silicon oxide taken into the WSi film is etched, or a reaction very similar to this. On the contrary, in case of the vapor phase-etching according to the present invention, it is appreciated that the reaction expressed by equation (1) is hardly caused on the surface of the WSi film, so that the WSi film cannot be dissolved.

Meanwhile in the second conventional example the AlGaAs layer below the electrode made of tungsten (W) is dissolved. This phenomenon is analyzed hereinbelow. That is, in the case of wet etching, Al, Ga and As all has strong ionization tendencies, so that although detailed reaction schemes are unclear, a current loop is formed between the gate electrode (W, Au), the AlGaAs crystal and the HF solution. Therefore, a portion of the AlGaAs film located in the vicinity of the gate metal is dissolved by means of an electrochemical reaction within the hydrofluoric acid etching liquid.

However, in case of vapor phase-etching, no movement of electric charge develops in the HF solution, so that the above-mentioned current loop results in an open circuit condition. Even if a small amount of liquid phase substances are collected on the surface of the substrate, the reaction does not progress once the equilibrium condition has been reached. Therefore a portion of the AlGaAs film is not caused to dissolve by the etching liquid as in the case of wet etching.

According to the selective etching method of the present invention, there can be eliminated problems that a portion of a lower portion of the side wall made of a refractory metal silicide is dissolved due to hydrofluoric acid based wet etching at the time of removing the silicon oxide film, and that the shape of the gate becomes disturbed locally, resulting in non-uniform electric field and current densities, leading to the deterioration of the electrical characteristic and reliability of the FET.

Further, according to the present invention, there can be eliminated a problem that, in a case where the outermost layer of the semiconductor is an AlGaAs layer, a portion of the AlGaAs located in the vicinity of the gate metal is dissolved excessively by the electrochemical reaction due to the hydrofluoric acid based etching liquid, changing the shape of the semiconductor surface, resulting in a deformation of the depletion layer leading to a decrease in the saturation current.

Further objects and advantages of the present invention will be apparent from the following description of the preferred embodiments of the invention as illustrated in the accompanying drawings.

DESCRIPTION OF THE PREFERRED EMBODIMENTS

Figure 1A:
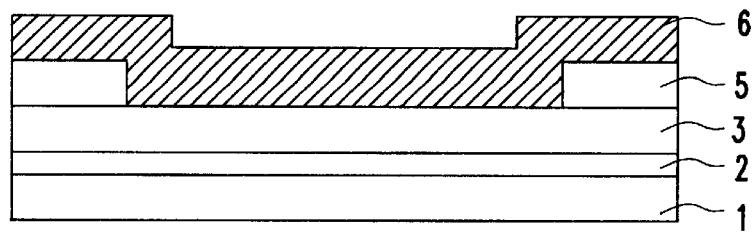
FIG. 1(*a*) to FIG. 1(*e*) are sectional views of a semiconductor substrate showing a semiconductor device fabrication process of a first embodiment according to the present invention.

The invention will now be described in detail with reference to the drawings showing embodiments according to the invention.

FIG. 1(*a*) to FIG. 1(*e*) are sectional views of a semiconductor substrate showing a semiconductor device fabrication process according to a first embodiment of the present invention. More specifically, they show process steps of fabricating a semiconductor device having a GaAs MESFET (metal semiconductor field-effect transmitters) construction.

In FIG. 1(*a*), an undoped GaAs buffer layer 2 having a thickness of 800 nm, a GaAs channel layer 3 having a thickness of 200 nm, which is doped with Si impurities by $2.5 \times 10^{17}/cm^3$, and a GaAs cap layer 5 having a thickness of 100 nm, which is doped with Si impurities by $5 \times 10^{17}/cm^3$ and is left only over a region at which a source and a drain will be formed are disposed on a semi-insulating GaAs substrate 1. Then, a silicon oxide film 6 is formed on a surface of the above-mentioned semiconductor substrate by about 500 nm in thickness.

Figure 1B:
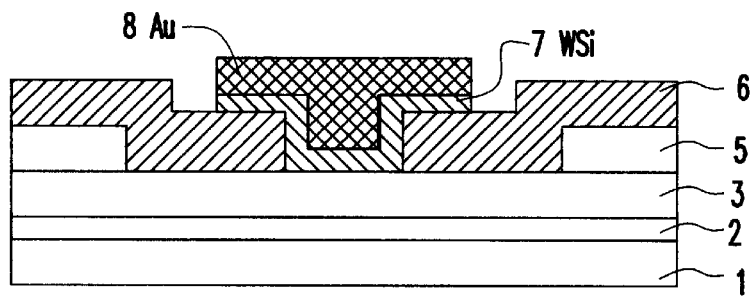

First, the silicon oxide film is partially removed to make an opening over a portion of the semiconductor substrate at which a gate is to be formed. Subsequently, WSi(Schottky metal) film 7, about 200 nm thick, is deposited, by a conventional sputtering method abutting the silicon oxide film. Over that, in order to further decrease the gate resistance, Au 8 is sputter deposited for about 400 nm. Next, by means of the usual photolithography, Ar ion-milling and $SF_6/CF_4$ gas magnetron reactive ion etching method using a photoresist as a mask, the WSi film 7 and Au film 8 is selectively etched away to form a gate electrode. After that, the photoresist is removed forming a gate electrode as shown in FIG. 1(b).

The above-mentioned method is similar to that of the first conventional example.

Figure 1C:
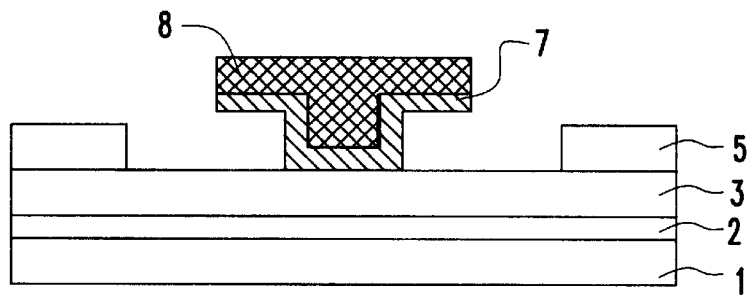
Figure 2:
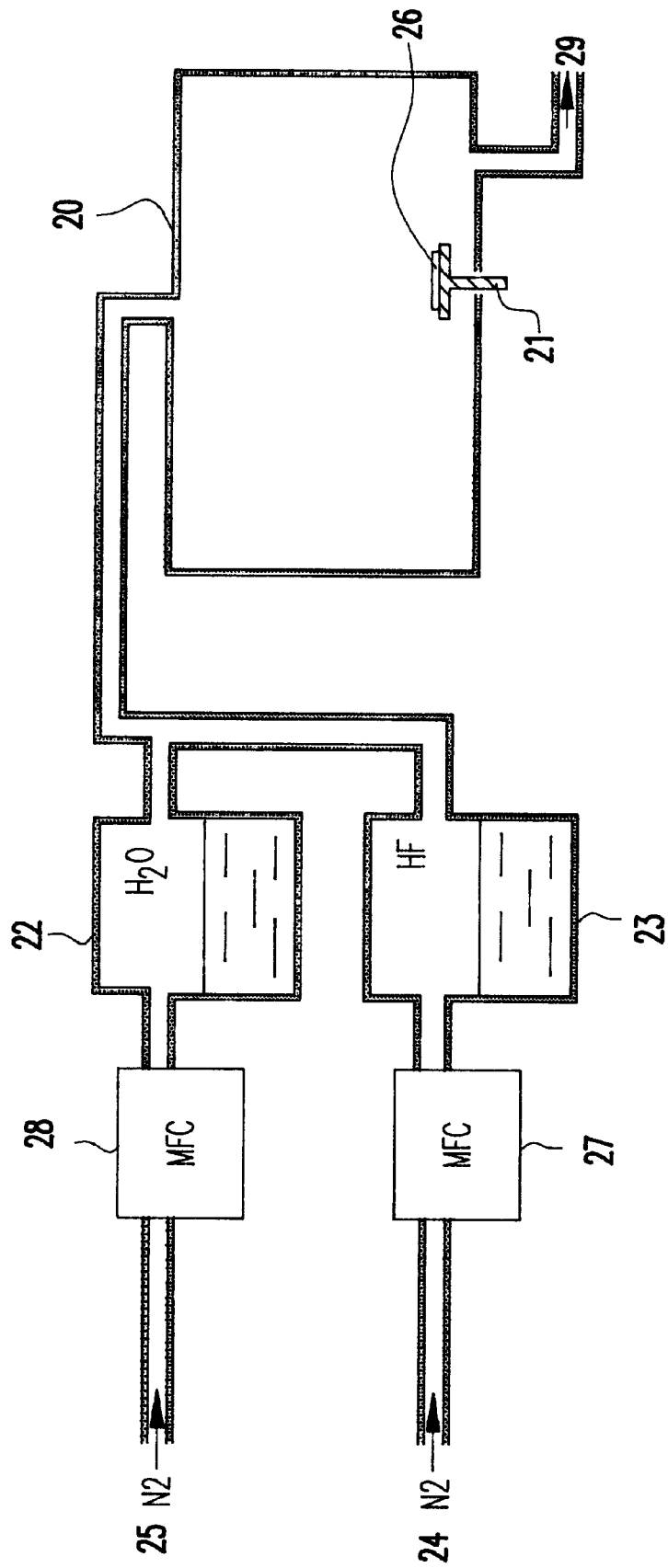
FIG. 2 is an explanatory view showing a vapor phase-etching apparatus used for the first embodiment according to the present invention.

Next, the silicon oxide film 6 is vapor phase-etched by gases including a vapor of hydrogen fluoride (HF), and the silicon oxide film 6 is removed as shown in FIG. 1(c). The vapor phase-etching is carried out by using the apparatus shown in FIG. 2. The wafer 26 is controlled at a temperature of 23 to 30° C. The vapor of HF is obtained by flowing $N_2$ carrier gas 24 along a surface of anhydrous hydrogen fluoride maintained at a temperature of 23 to 30° C. in an HF vaporizing tank 23. Similarly, a water vapor is obtained by making a carrier gas 25 of $N_2$ flow along a surface of deionized water in an $H_2O$ vaporizing tank 22. The carrier gas 24 of $N_2$ is introduced into the vaporizing tank 23 through a mass flow controller 27, and the carrier gas 25 of $N_2$ is introduced into the vaporizing tank 22 through a mass flow controller 28, and then an etching gas having a desired composition ratio is obtained by controlling respective flow rates of the carrier gasses 24, 25. If the ratio (flow rate ratio) of the flow rate of the $N_2$ carrier gas 24 for HF (hereinafter abbreviated to as [HF]) to the flow rate of the $N_2$ carrier gas 25 for $H_2O$ (hereinafter abbreviated to as [$H_2O$]) is set to a value less than 1, no abnormal dissolution phenomenon of WSi and AlGaAs located at a lower portion of the gate electrode is observed. In this embodiment, the flow rates were optimized to be [HF]=5 l/min, and [$H_2O$]=15 l/min based on the etching rate of silicon oxide and residues left on the surface of the semiconductor substrate, and the like. These vapors are mixed together, transferred to a processing chamber 20 and blown through a diffuser on the surface of the wafer 26 which is placed on a spinner 21, thereby etching the silicon oxide. After that, the used gas mixture is discarded through a discharging port 29.

Figure 1D:
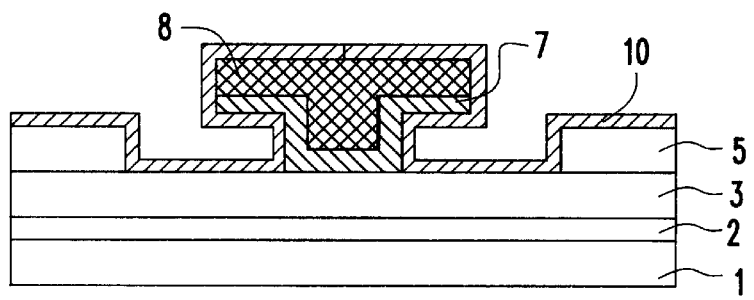
Figure 1E:
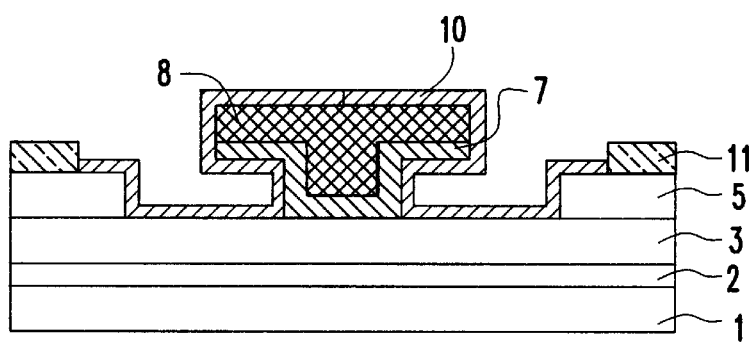

After the vapor phase-etching is done, similarly to the conventional example 1, a silicon oxide film 10 is formed by about 100 nm in thickness over the entire surface of the semiconductor substrate to serve as a passivation film, as shown in FIG. 1(d). Lastly, ohmic electrodes 11 made of AuGeNi are formed, as shown in FIG. 1(e), through processes of forming an opening to the passivation film, making a metal film used for the ohmic electrode, lifting off, annealing, and so forth, whereby the semiconductor device having the MESFET construction is completed.

FIG. 3(a) to FIG. 3(e) are sectional views of a semiconductor substrate showing a semiconductor device fabrication process according to a second embodiment of the present invention. More specifically, they show process steps of fabricating a semiconductor device having an AlGaAs/GaAs HJFET construction.

Figure 3A:
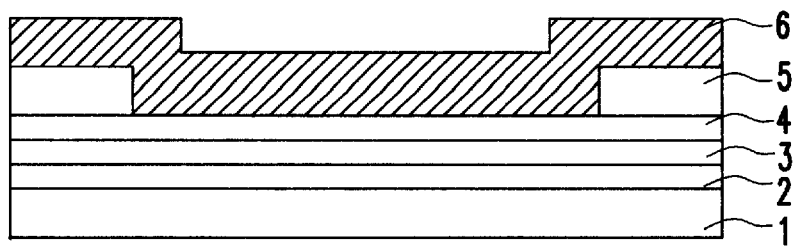
FIG. 3(*a*) to FIG. 3(*e*) are sectional views of a semiconductor substrate showing a semiconductor device fabrication process of a second embodiment according to the present invention.

In FIG. 3(a), an undoped GaAs buffer layer 2 having a thickness of 800 nm, a GaAs channel layer 3 having a thickness of 200 nm, into which Si impurities are not doped, an $Al_{0.2}Ga_{0.8}As$ layer 4, which is made into an electron supplying layer, having a thickness of 50 nm in thickness, into which Si impurities are doped by $3\times10^{15}/cm^3$, and a GaAs cap layer 5 having a thickness of 80 nm in thickness, which is doped with Si impurities of high concentration by $3\times10^{15}/cm^3$ and is left over only at a region thereof at which a source and a drain are to be formed are disposed on a semi-insulating GaAs substrate 1. Then, a silicon oxide film 6 is formed on a surface of the above-mentioned semiconductor substrate by about 500 nm in thickness.

Figure 3B:
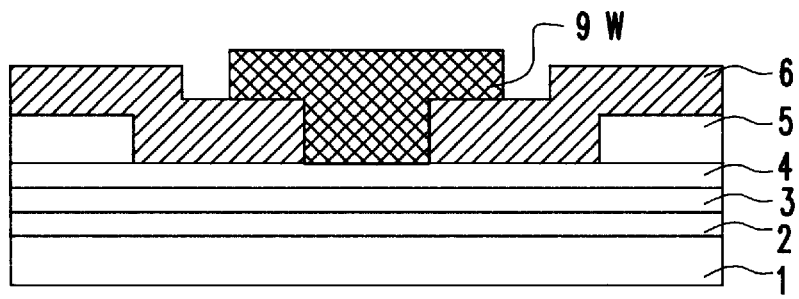

First, the silicon oxide film 6 is partially removed to form an opening at a portion of the semiconductor substrate at which a gate is to be formed. An about 500 nm thick W film 9 is formed by the conventional sputtering method. Next, by means of the usual photolithography, and $SF_6/CF_4$ gas magnetron reactive ion etching method using a photoresist as a mask, the W film 9 is selectively etched away to form a gate electrode. The photoresist is removed to form a gate electrode as shown in FIG. 3(b).

Figure 3C:
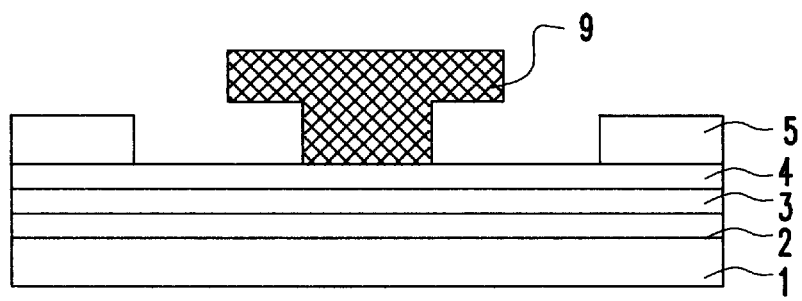

Next, as in the first embodiment, the thick silicon oxide film 6 is vapor phase-etched by the gas including the vapor of hydrogen fluoride, thereby removing it as shown in FIG. 3(c).

Figure 3D:
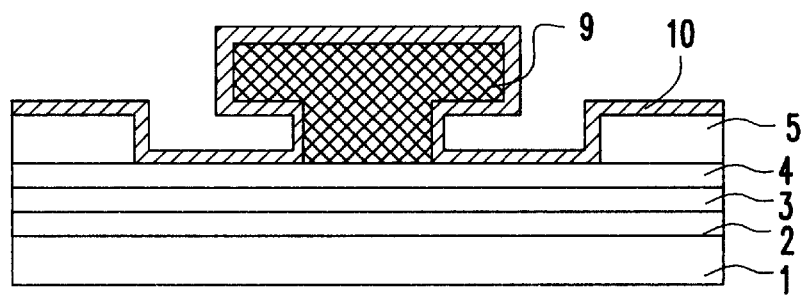
Figure 3E:
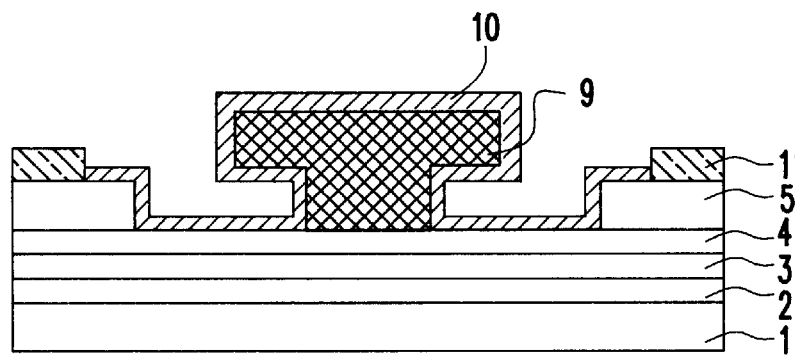
Figure 4A:
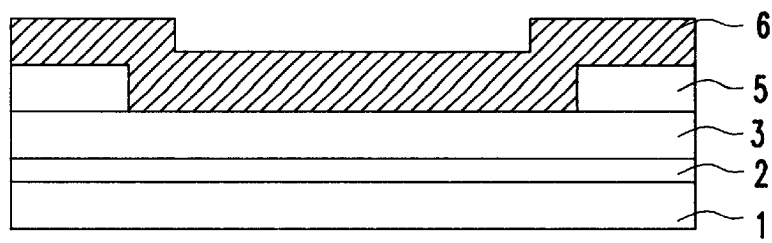
FIG. 4(*a*) to FIG. 4(*e*) are sectional views of a semiconductor substrate showing a first conventional example according to the conventional semiconductor device fabrication method.
Figure 4B:
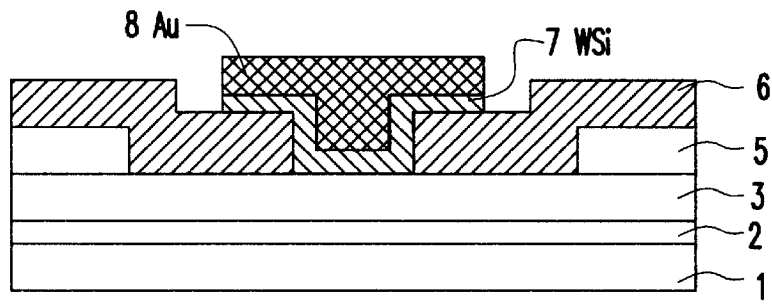
Figure 4C:
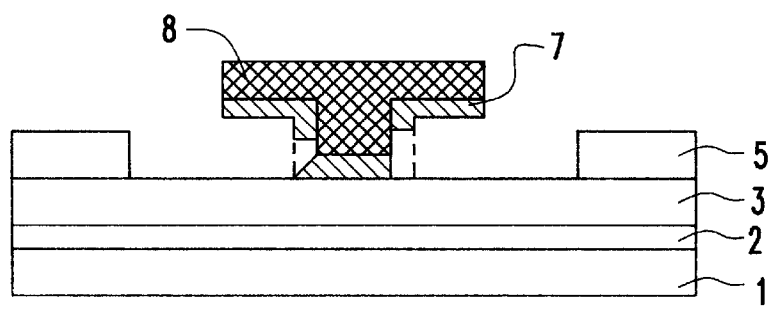
Figure 4D:
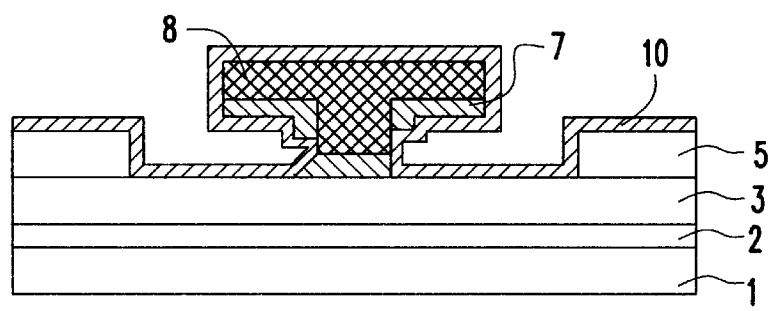
Figure 4E:
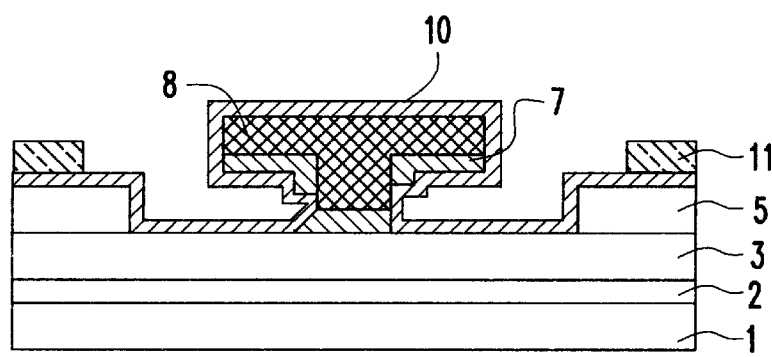
Figure 5A:
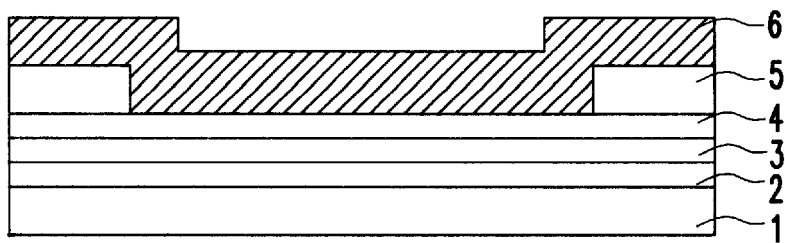
FIGS. 5(*a*) to 5(*e*) are sectional views of a semiconductor substrate showing a second conventional example according to the conventional semiconductor device fabrication method.
Figure 5B:
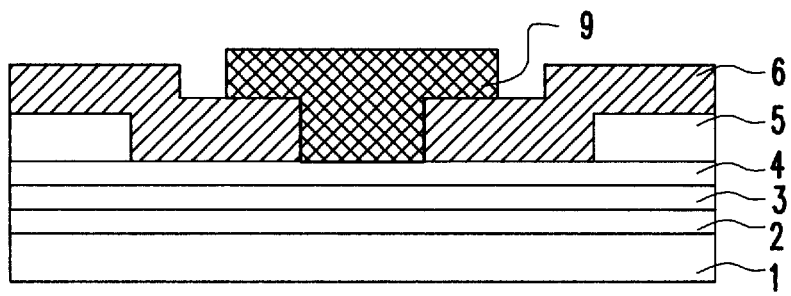
Figure 5C:
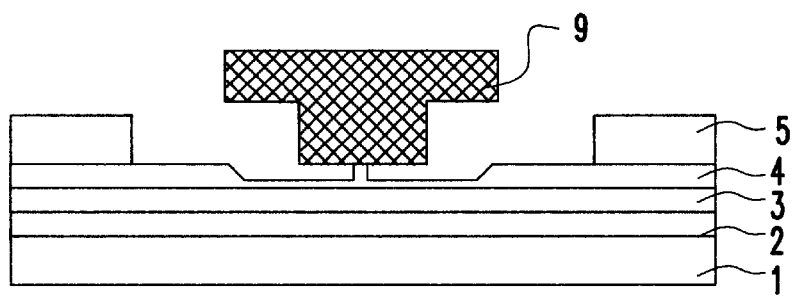
Figure 5D:
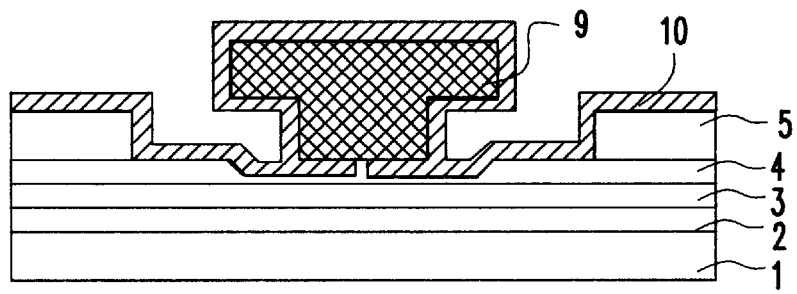
Figure 5E:
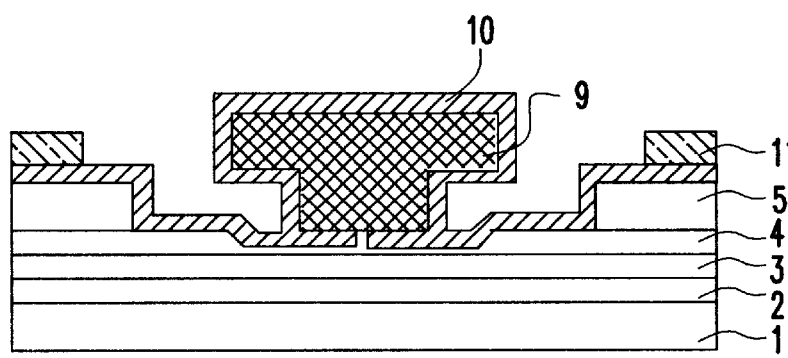

Further, a passivation silicon oxide film 10 is formed (FIG. 3(d)), and thereafter, AuGeNi ohmic electrodes 11 corresponding to a drain electrode and a source electrode are formed by vacuum evaporation (FIG. 3(e)), whereby a semiconductor device having the HJFET construction is completed.

In the above-mentioned first and second embodiments, vapors from the anhydrous hydrogen fluoride and a deionized water are used. However, when only vapor vaporized from the hydrogen fluoride solution (hydrofluoric acid) controlled to temperatures between 20 to 30° C., was used without using the $H_2O$ vaporizing tank, the same effect as those of the above-mentioned first and second embodiments was obtained. In this case, there are advantages that the vapor phase-etching apparatus becomes simple in its construction, and that the control thereof becomes easy.

In a case where the carrier gas of $N_2$ was made to flow by 5 to 20 l/min and HF diluted by $H_2O$ to 10 to 30% volumetric concentration, the etching rate of 20 to 40 nm/min was obtained for $SiO_2$. The etching could be carried out in a desired manner without attacking the WSi film nor the AlGaAs film located at the lower portion of the gate electrode.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of vapor phase selective etching for fabricating a semiconductor device, comprising the steps of:

providing a gate electrode including a refractory metal silicide and a silicon oxide film on a surface of a semiconductor substrate, wherein said silicon oxide film includes a surface abutting a surface of said refractory metal silicide; and removing at least said surface of said silicon oxide film abutting said refractory metal silicide by a gas including a vapor of hydrogen fluoride while keeping said refractory metal silicide intact.

2. The method of vapor phase etching for fabricating a semiconductor device as claimed in claim 1, wherein said gas including said vapor of hydrogen fluoride comprises a mixture of vapors of anhydrous hydrofluoric acid and $H_2O$.

3. The method of vapor phase etching for fabricating a semiconductor device as claimed in claim 1, wherein said gas including said vapor of hydrogen fluoride comprises a gas mixture of a nitrogen gas including a vapor of anhydrous hydrofluoric acid and a nitrogen gas including a vapor of $H_2O$, wherein a ratio of said nitrogen gas including said vaporized anhydrous hydrofluoric acid to said nitrogen gas including said vapor of $H_2O$ is less than 1.

4. The method of vapor phase etching for fabricating a semiconductor device as claimed in claim 1, wherein said vapor of hydrogen fluoride is obtained from a liquid solution of hydrogen fluoride.

5. The method of vapor phase etching for fabricating a semiconductor device as claimed in claim 1, wherein said gas including said vapor of hydrogen fluoride comprise a nitrogen gas including a vapor of hydrogen fluoride vaporized from a hydrogen fluoride water solution which is 10 to 30% in volumetric concentration.

6. The method of vapor phase etching for fabricating a semiconductor device as claimed in claim 1, further comprising following said step of removing the step of forming ohmic electrodes on said semiconductor substrate, and wherein said semiconductor device is a MESFET.

7. The method of vapor phase etching for fabricating a semiconductor device as claimed in claim 1, wherein said semiconductor substrate comprises, in this order, a semi-insulating GaAs substrate, an undoped GaAs buffer layer, and a GaAs channel layer doped with silicon impurities in contact with said refractory metal silicide.

8. The method of vapor phase etching for fabricating a semiconductor device as claimed in claim 1, wherein said refractory metal silicide is tungsten.

9. The method of vapor phase etching for fabricating a semiconductor device as claimed in claim 3, wherein said gas including said vapor of hydrogen fluoride comprise a nitrogen gas including a vapor of hydrogen fluoride vaporized from hydrogen fluoride water solution which is 10 to 30% in volumetric concentration.

10. A method of vapor phase selective etching for fabricating a semiconductor device, comprising the steps of;

providing a gate electrode including a Schottky metal film and a silicon oxide film on a surface of a semiconductor substrate, wherein said semiconductor substrate includes an AlGaAs layer onto which the gate electrode is formed and said silicon oxide film includes a surface abutting a surface of said Schottky metal and said AlGaAs layer; and removing at least said surface of said silicon oxide film abutting said Schottky metal and said AlGaAs layer by a gas including a vapor of hydrogen fluoride while keeping said AlGaAs layer intact.

11. The method of vapor phase etching for fabricating a semiconductor device as claimed in claim 10, wherein said gas including said vapor of hydrogen fluoride comprises a mixture of vapors of anhydrous hydrofluoric acid and $H_2O$.

12. The method of vapor phase etching for fabricating a semiconductor device as claimed in claim 10, wherein said gas including said vapor of hydrogen fluoride comprises a gas mixture of a nitrogen gas including a vapor of anhydrous hydrofluoric acid and a nitrogen gas including a vapor of $H_2O$, wherein a ratio of said nitrogen gas including said vaporized anhydrous hydrofluoric acid to said nitrogen gas including said vapor of $H_2O$ is less than 1.

13. The method of vapor phase etching for fabricating a semiconductor device as claimed in claim 10, wherein said vapor of hydrogen fluoride is obtained from a liquid solution of hydrogen fluoride.

14. The method of vapor phase etching for fabricating a semiconductor device as claimed in claim 10, wherein said gas including said vapor of hydrogen fluoride comprise a nitrogen gas including a vapor of hydrogen fluoride vaporized from a hydrogen fluoride water solution which is 10 to 30% in volumetric concentration.

15. The method of vapor phase etching for fabricating a semiconductor device as claimed in claim 10, further comprising following said step of removing the steps of forming a GaAs cap layer on said semiconductor substrate, and forming ohmic electrodes on said GaAs cap layer, and wherein said semiconductor device is an HJFET.

16. The method of vapor phase etching for fabricating a semiconductor device as claimed in claim 10, wherein said semiconductor substrate comprises, in this order, a semi-insulating GaAs substrate, an undoped GaAs buffer layer, a GaAs channel layer, and said AlGaAs layer in contact with said Schottky metal film, wherein said AlGaAs layer is doped with silicon impurities.

17. The method of vapor phase etching for fabricating a semiconductor device as claimed in claim 10, wherein said Schottky metal film is tungsten.

18. The method of vapor phase etching for fabricating a semiconductor device as claimed in claim 12, wherein said gas including said vapor of hydrogen fluoride comprise a nitrogen gas including a vapor of hydrogen fluoride vaporized from hydrogen fluoride water solution which is 10 to 30% in volumetric concentration.

* * * * *